(12) United States Patent
Zheng et al.

(10) Patent No.: US 7,408,802 B2
(45) Date of Patent: Aug. 5, 2008

(54) NANO-CONTACTED MAGNETIC MEMORY DEVICE

(75) Inventors: Yuankai Zheng, Singapore (SG); Yihong Wu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/577,216
(22) PCT Filed: Oct. 26, 2004
(86) PCT No.: PCT/SG2004/000356
§ 371 (c)(1),
(2), (4) Date: Nov. 28, 2006
(87) PCT Pub. No.: WO2005/043545
PCT Pub. Date: May 12, 2005

(65) Prior Publication Data
US 2007/0165449 A1  Jul. 19, 2007

Related U.S. Application Data
(60) Provisional application No. 60/515,994, filed on Oct. 31, 2003.

(51) Int. Cl.
G11C 11/00  (2006.01)
(52) U.S. Cl. .................. 365/158; 365/171; 365/173
(58) Field of Classification Search .............. 365/158, 365/171, 173, 148, 164; 257/295, E21.665
See application file for complete search history.

(56) References Cited

U.S. PATENT DOCUMENTS

| 4,731,757 | A | 3/1988 | Daughton et al. |
| 5,296,716 | A | 3/1994 | Ovshinsky et al. |
| 6,021,065 | A | 2/2000 | Daughton et al. |
| 6,259,644 | B1 | 7/2001 | Tran et al. |
| 6,317,375 | B1 | 11/2001 | Perner |

(Continued)

FOREIGN PATENT DOCUMENTS

| EP | 1339065 A2 | 8/2003 |
| WO | WO 2002/059973 A2 | 8/2002 |

OTHER PUBLICATIONS

International Search Report mailed Jan. 18, 2005 in corresponding International Application No. PCT/SG2004/000356.

(Continued)

Primary Examiner—David Lam
(74) Attorney, Agent, or Firm—Davidson Berquist Jackson & Gowdey LLP

(57) ABSTRACT

A magnetic memory device includes a plurality of transistors (316, 317) formed on a substrate and a common magnetic memory block (312) including a multiple effective magnetoresistive elements (318, 319), a ferromagnetic recording (312), a non-magnetic space (232), and a free magnetic reading (322) layer formed above the transistors (316, 317). An extended common digital line (315) is located above a common magnetic memory block (312) which is electrically connected with a respective source/drain electrode of the transistors (316, 317) through each a contact at a respective active area. The specific magnetization state of the ferromagnetic recording layer at the active areas can be changed by a heating process and applying an external field induced from the common digital line (315), the bit (309, 311) or word (307) lines. The change in resistance of the effective magnetoresistive element (318, 319) can be detected by means of changing the magnetization state of the free magnetic reacting layer during reading, thus a smaller switching field is required.

26 Claims, 12 Drawing Sheets

U.S. PATENT DOCUMENTS

| | | | |
|---|---|---|---|
| 6,341,084 | B2 | 1/2002 | Numata et al. |
| 6,535,416 | B1 | 3/2003 | Daughton et al. |
| 6,597,618 | B2 | 7/2003 | Zheng et al. |
| 6,944,049 | B2 * | 9/2005 | Hoenigschmid et al. .... 365/158 |
| 2002/0036917 | A1 | 3/2002 | Nishimura et al. |
| 2004/0125646 | A1 | 7/2004 | Durlam et al. |

OTHER PUBLICATIONS

Written Opinion mailed Jan. 18, 2005 in corresponding International Application No. PCT/SG2004/000356.

International Preliminary Examination Report completed Sep. 20, 2005 in corresponding International Application No. PCT/SG2004/000356.

Beech, R.S. et al. "Curie point written magnetoresistive memory", J. Appl. Phys. 87, No. 9, pp. 6403-6405, 2000.

Zheng, Y.K. et al. "High-thermal stability MRAM with SAF layer", IEEE Trans. MAG 40, No. 4, pp. 2248-2250, 2004.

Zheng, Y.K. et al. "Sub-100nm current-perpendicular-to-plane sensor fabrication", IEEE Trans. MAG. 40, No. 4, pp. 2634-2636, 2004.

* cited by examiner

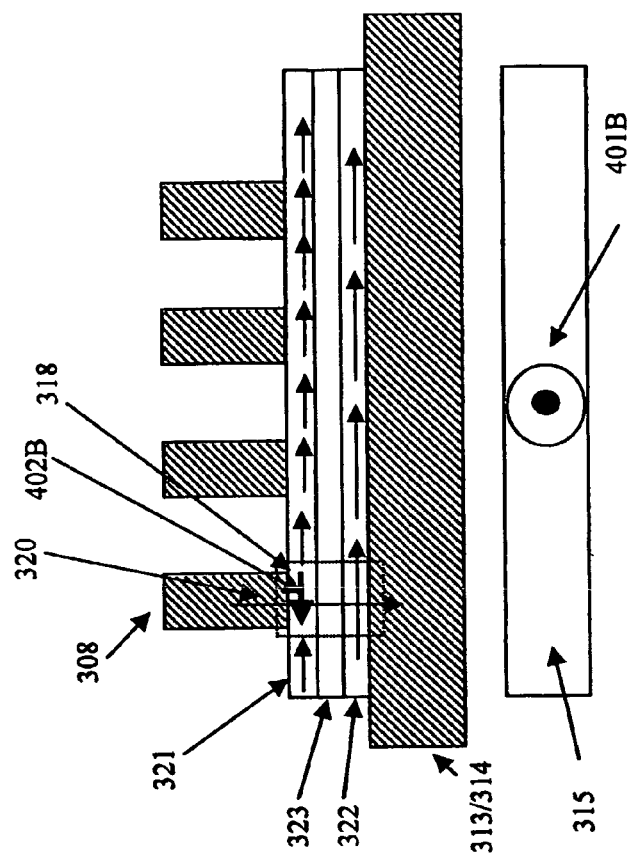
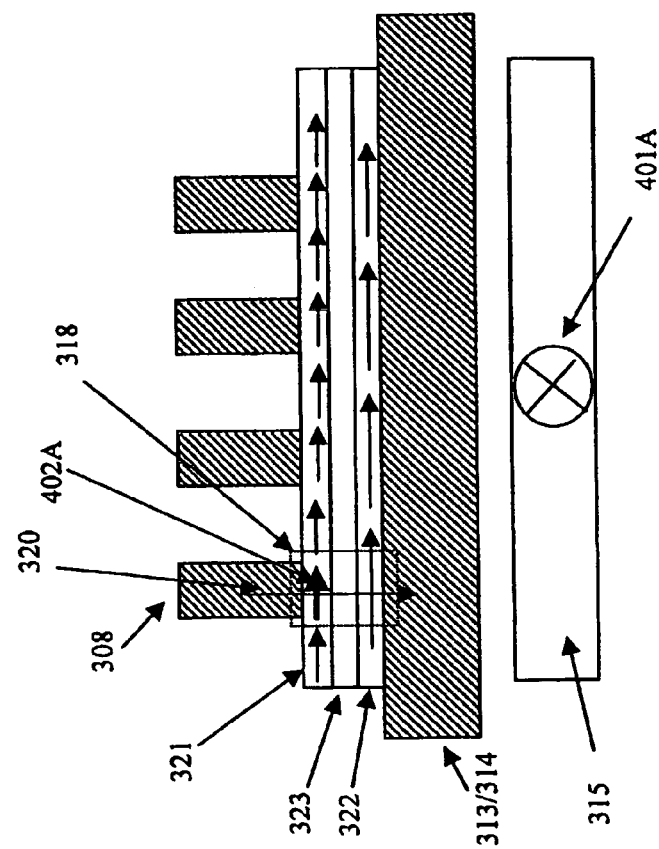

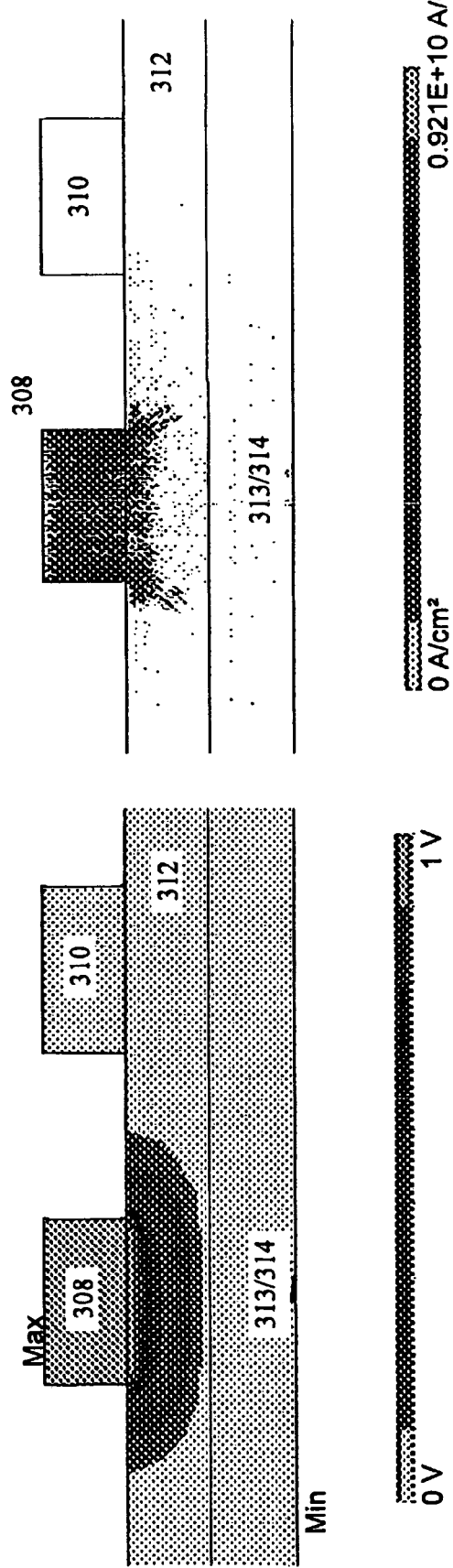

NANO-CONTACTED MAGNETIC MEMORY DEVICE

CROSS REFERENCE TO RELATED APPLICATIONS

This application is the National Phase of International Application PCT/SG2004/000356 filed Oct. 24, 2004 which designated the U.S. and that International Application was published under PCT Article 21(2) in English. International Application PCT/SG2004/000256 filed Oct. 26, 2004 claims priority to U.S. Provisional Application Ser. No. 60/515,994 filed Oct. 31, 2003. The entire contents of each of these applications are herein incorporated by reference.

FIELD OF THE INVENTION

The present invention relates to a magnetic memory device. In particular, it relates to a magnetoresistive random access memory (MRAM) device with current-perpendicular-to-plane (CPP) MRAM cells that write data by thermal assisted techniques.

BACKGROUND OF THE INVENTION

Memory devices are used in a wide variety of applications. Such applications include personal computers, consumer products such as digital cameras, digital video cameras and mobile phones. There exist many different memory devices. The type of memory devices chosen for a specific function depends largely upon what features of these devices are best suited to perform that specific function. For instance, volatile memories, such as dynamic random access memories (DRAMs) must be continually powered in order to retain their contents. However, DRAMs tend to provide greater storage capability and programming option and cycle than non-volatile memories such as read only memories (ROMs). Efforts have been underway to create a commercially viable memory device that is both random access and non-volatile. Ovshinsky et al. disclosed a phase changed memory or chalcogenide random access memory (CRAM), which includes a chalcogenide material or phase change material, in U.S. Pat. No. 5,296,716. The phase change material can be electrically switched between generally amorphous and generally crystalline states. However, the fatigue property is a key issue in CRAM due to high temperature heating. The cell uniformity in products is also a key issue due to the reading method. Since the cell resistance is detected during reading, any non-uniform cell resistance generates an error. A magnetoresistive random access memory (MRAM) device as disclosed by Daughton J. M. in U.S. Pat. No. 4,731,757 and in U.S. Pat. No. 6,021,065 is another type of solid state, non-volatile memory device. A conventional MRAM device includes a column of first electrical wires, referred to as "word lines", and a row of second electrical wires, referred to as "bit lines". An array of memory cells located at junctions of the word lines and the bit lines is used to record data signals.

A typical memory cell of a MRAM comprises a magnetoresistive element, wherein the magnetoresistive element comprises a hard magnetic layer, a soft magnetic layer, and a non-magnetic layer sandwiched between the hard magnetic layer and the soft magnetic layer. The hard magnetic layer has its magnetization vector fixed in one direction. The orientation of the fixed magnetization vector does not change under a magnetic field applied thereon. The soft magnetic layer has an alterable magnetization vector under a magnetic field applied thereon, that either points to the same direction, hereinafter "parallel alignment", or opposite direction, hereinafter "anti-parallel alignment", of the magnetization vector of the hard magnetic layer. Since the resistances of the magnetoresistive element in the "parallel alignment" status and the "anti-parallel alignment" status are different, the two types of alignment status can be used to record two logical states—the "0"s or "1"s of a data bit.

In a write operation, electric currents pass completely through the word line and the bit line adjacent to a memory cell. When the electric currents reach a certain threshold, the magnetic field generated by the electric currents switches the orientation of the magnetization vector of the soft magnetic layer in the magnetoresistive element. As a result, magnetization of the hard magnetic layer and the soft magnetic layer changes from one type of alignment, e.g. "parallel alignment", to the other type of alignment, e.g. "anti-parallel alignment", so that a data bit of a data signal can be recorded in the memory cell.

In order to increase the thermal stability of a memory cell, a Curie point written MRAM has been proposed to improve the MRAM stability, as described in U.S. Pat. No. 6,535,416 to J. M. Daughton et al., and in a paper by R. S. Beech et al. entitled "Curie point written magnetoresistive memory", J. Appl. Phys. 87, No. 9, pp. 6403-6405, 2000. A Curie point written structure has been disclosed in these structures, where a single pinned layer is used as storage layer. The pinned layer has a higher anisotropy than an unpinned layer that is not pinned by another layer. The use of the pinned layer for information storage provides improved thermal stability, allowing the size of a memory cell to be further reduced before thermal instability becomes a limiting factor.

In order to increase the density of MRAM cells the MRAM structure can be simplified as mentioned in U.S. Pat. No. 6,597,618, U.S. Pat. No. 6,341,084, U.S. Pat. No. 6,317,375 and U.S. Pat. No. 6,259,644.

Most MRAMs use a vertical structure or a current-perpendicular-to-plane (CPP) structure due to their integration with high density in a semiconductor device. The CPP structure may be a magnetic tunnel junction (MTJ) element or a CPP spin-valve element, which are both magnetoresistive elements. Generally, an MTJ element comprises a ferromagnetic free layer such as CoFe, an insulator layer such as AlO, a ferromagnetic pinned layer such as CoFe, and an antiferromagnetic pinning layer. As the size of a memory cell scales down to sub-100 nm, a thin insulator layer less than 1 nm is required to reduce the resistance of the MTJ element. As the insulator layer gets thinner, the resistance uniformity of the MTJ element deteriorates. A typical CPP spin-valve element comprises a ferromagnetic free layer such as CoFe, a metallic space layer such as Cu, a ferromagnetic pinned layer such as CoFe, and an antiferromagnetic pinning layer. As mentioned above, the uniformity of the resistance of the CPP spin-valve element is a key issue. One solution is to detect the magnetization state of the ferromagnetic pinned layer by changing the magnetization state of the ferromagnetic free layer during a read operation. The non-uniformity issue can be overcome by detecting the resistance change. However, as the size of the MTJ element or of the CPP spin-valve element scales down, an increased read power is required to switch the smaller memory cell.

SUMMARY OF THE INVENTION

In a first embodiment of the present invention, a high density and low cost MRAM unit is presented. The MRAM unit includes a substrate, a plurality of transistors formed on said substrate, a common memory block, a plurality of contacts, and a common electrode. Each of the plurality of transistors is a field-effect transistor including a first source/drain electrode, a second source/drain electrode and a gate electrode. The common memory block includes a ferromagnetic recording layer, a free magnetic reading layer, a non-magnetic space layer between the ferromagnetic recording layer and the free magnetic reading layer, and a plurality of active areas defined in the common memory block. Each of the plurality of contacts electrically connects a respective one of the first source/drain electrodes with a corresponding one of the plurality of active areas. The common electrode is in electrical contact with the plurality of contacts through the common memory block and serves as bit line for the first source/drain electrodes. Each of the plurality of active areas forms an effective magnetoresistive element. Each of the plurality of transistors is controllable to electrically activate a corresponding one of the plurality of contacts and thereby to write/read a data bit into/from the ferromagnetic recording layer at a respective one of the effective magnetoresistive elements.

In a second embodiment of the present invention, a method for writing data in a MRAM unit is presented. In this embodiment, the MRAM unit includes a plurality of transistors on a substrate, a common memory block, a common electrode, and a common digital line. Each of the plurality of transistors is a field-effect transistor and includes first and second source/drain electrodes and a gate electrode. The common memory block electrically connects to each of the first source/drain electrodes through in each case one of a plurality of contacts. The common electrode electrically contacts the plurality of contacts through the common memory block. The common digital line is provided electrically isolated next to the common electrode on an opposite side of the common electrode with respect to the common memory block. The common memory block includes a ferromagnetic recording layer, a free magnetic reading layer, a non-magnetic space layer between the ferromagnetic recording layer and the free magnetic reading layer and a plurality of active areas defined in the common memory block. The method includes the operation of controlling the plurality of transistors for electrically activating a corresponding one of the plurality of contacts, thereby electrically activating a respective active area of the plurality of active areas, the activated respective active area serving as effective magnetoresistive element. The method further includes the operation of raising the temperature of the ferromagnetic recording layer at the effective magnetoresistive element to approach or exceed its critical temperature independently of other active areas, thereby reducing the coercitivity of the ferromagnetic recording layer at the effective magnetoresistive element. Furthermore, the method includes the operation of writing a magnetization state representing a bit of the data in the ferromagnetic recording layer at the effective magnetoresistive element by passing a current through the common digital line.

In a third embodiment of the present invention, a method of performing a read operation in a MRAM unit is presented. In this embodiment, the MRAM unit includes a plurality of transistors on a substrate, a common memory block, a common electrode, and a common digital line. Each of the plurality of transistors is a field-effect transistor and includes first and second source/drain electrodes and a gate electrode. The common memory block electrically connects to each of the first source/drain electrodes through in each case one of a plurality of contacts. The common electrode electrically contacts the plurality of contacts through the common memory block. The common digital line is provided electrically isolated next to the common electrode on an opposite side of the common electrode with respect to the common memory block. The common memory block includes a ferromagnetic recording layer, a free magnetic reading layer, a non-magnetic space layer between the ferromagnetic recording layer and the free magnetic reading layer and a plurality of active areas defined in the common memory block. The method includes the operation of controlling the plurality of transistors for electrically activating a corresponding one of the plurality of contacts, thereby electrically activating a respective active area of the plurality of active areas, the activated respective active area serving as effective magnetoresistive element. The method further includes the operation of applying a current through the common digital line, thereby adjusting all magnetization states in the free magnetic reading layer. Furthermore, the method includes the operation of determining the magnetization state of the ferromagnetic recording layer at the effective magnetoresistive element. The resistance states of the ferromagnetic recording layer at the effective magnetoresistive element are dependent on the relative angles between the magnetization vectors of the ferromagnetic recording layer at the effective magnetoresistive element and of the free magnetic reading layer.

These and other features of the present invention will be better understood when viewed in light of the following drawings and detailed description.

BRIEF DESCRIPTION OF THE DRAWINGS

FIGS. 4A and 4B show the detailed writing process for the MRAM cell structure shown in FIG. 3A;

FIGS. 6A and 6B show the voltage potential and current density distributions for the CPP type MRAM cell after considering a neighboring contact according to the embodiment of the present invention;

DETAILED DESCRIPTION OF THE INVENTION

It is pointed out that in the present application the term "critical temperature" is substantially the blocking temperature for antiferromagnetic (AFM) material, which can be less than the Néel temperature. The critical temperature is substantially the Curie temperature for ferromagnetic material. The blocking temperature of an AFM layer is the temperature at or above which the AFM layer loses its ability to "pin" (i.e. fix) the magnetization of an adjacent ferromagnetic layer below the Curie temperature of the adjacent ferromagnetic layer.

Figure 1A:
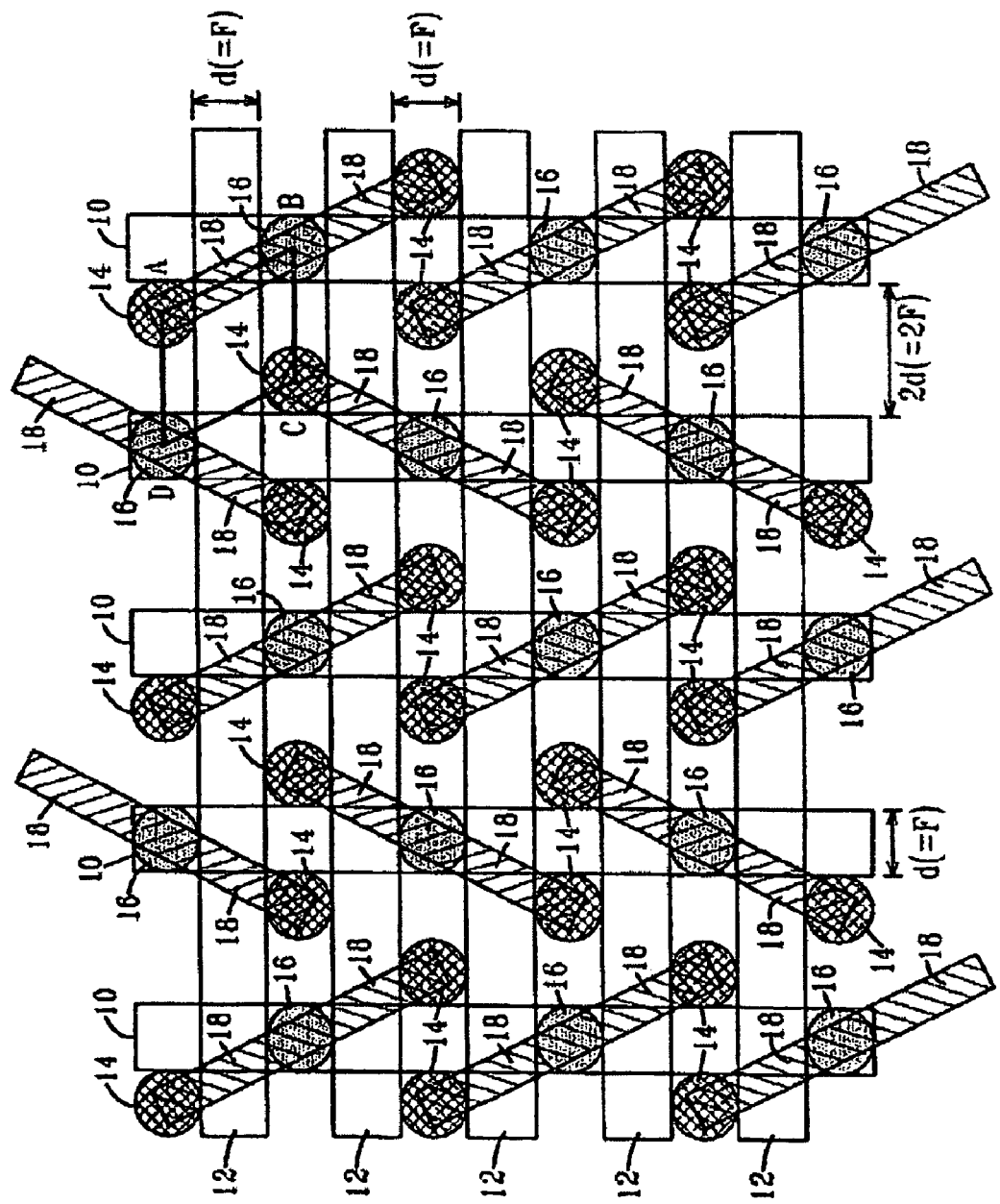
FIG. 1A is a top view of a layout of a $6F^2$ DRAM cell structure according to the prior art.
Figure 1C:
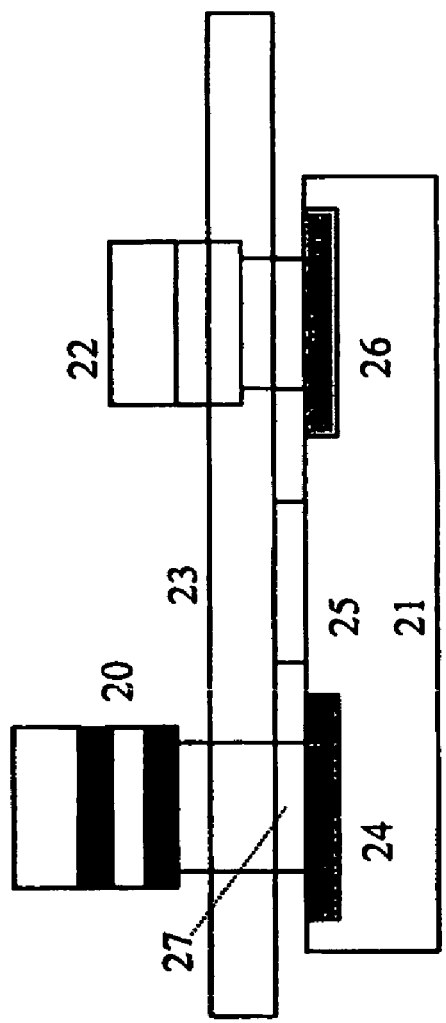
FIG. 1C is a cross section of a DRAM cell according to the prior art.
Figure 1B:
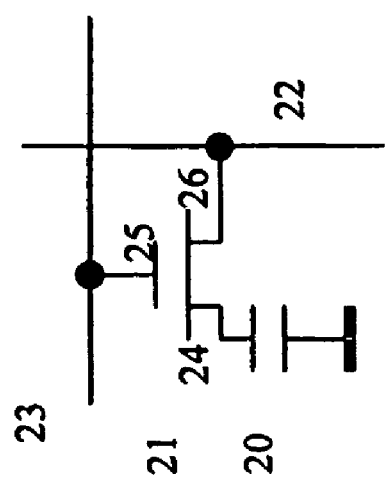
FIG. 1B is an equivalent circuit of one DRAM cell according to the prior art.

FIG. 1A shows a top view of a layout of a $6F^2$ DRAM cell structure according to the prior art. The DRAM cell structure includes vertical bit lines 10, horizontal word lines 12, capacitor contacts 14, bit line contacts 16, and active (diffusion) areas 18 that include each a source region and a drain region. The word lines 12 electrically contact with gate electrodes (not shown) and the bit lines 10 electrically contact with the source regions. The capacitor contacts 14 are located between the capacitors and the drain regions. FIG. 1B shows an equivalent circuit of one DRAM cell of said DRAM cell structure shown in FIG. 1A. A capacitor 20 is electrically connected with the drain electrode 24 of a transistor 21. A word line 23 is electrically connected with the gate electrode 25 of the transistor 21. Further, a bit line 22 is electrically connected with the source electrode 26 of the transistor 21. FIG. 1C shows a cross section of said DRAM cell of FIG. 1B. Therein, the capacitor 20 is electrically connected with the source electrode 26 of the transistor 21 through a contact 27. According to the prior art, the capacitor 20 can be a stacked capacitor or a trench capacitor in order to increase the capacity.

Figure 2B:
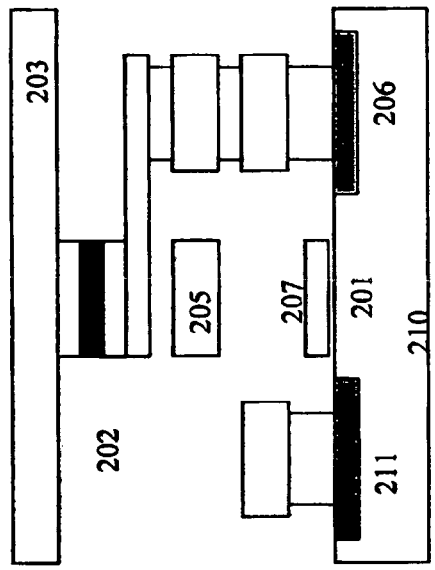
FIG. 2B is a cross section of the CPP type MRAM cell with a transistor shown in FIG. 2A.
Figure 2C:
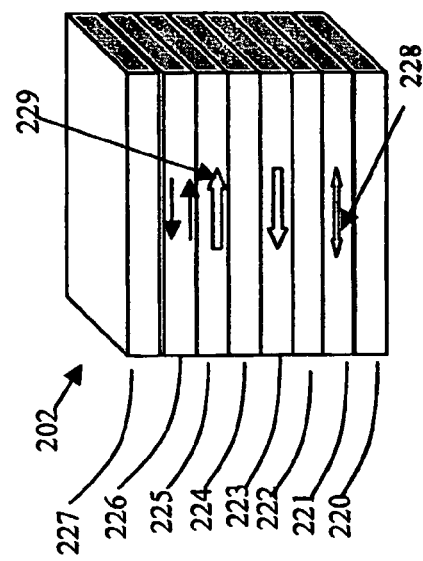
FIG. 2C is an enlarged view showing a magnetoresistive element of the CPP type MRAM cell shown in FIG. 2A.
Figure 2A:
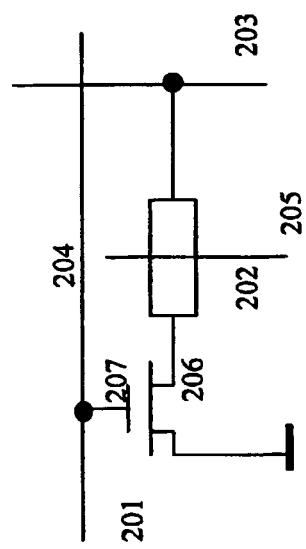
FIG. 2A is an equivalent circuit of a CPP type MRAM cell with a transistor according to the prior art.

FIG. 2A shows an equivalent circuit of a typical current-perpendicular-to-plane (CPP) type MRAM cell with a transistor 201 according to the prior art. A bit line 203 is electrically connected with the drain electrode 206 of the transistor 201 through a magnetoresistive element 202. A word line 204 is electrically connected with the gate electrode 207 of the transistor 201. A digital line 205 crosses the magnetoresistive element 205. FIG. 2B shows a cross section of said typical CPP type MRAM cell with transistor 201 shown in FIG. 2A. The source electrode 211, the gate electrode 207, and the drain electrode 206 of said transistor 201 are formed on a substrate 210. The digital line 205 is burned under the magnetoresistive element 202. The magnetoresistive element 202 is electrically connected with said bit line 203. The magnetoresistive element 202 as shown in detail in FIG. 2C comprises a template layer 220, a free layer 221, a first non-magnetic space layer 222, a first ferromagnetic layer 223, a second non-magnetic space layer 224, a second ferromagnetic layer 225, an antiferromagnetic (AFM) layer 226, and a cap layer 227. These layers are disposed in sequence as shown in FIG. 2C. The magnetization direction of the second ferromagnetic layer 225 is pinned by the AFM layer 226 and the first ferromagnetic layer 223 is antiferromagnetically coupled to the second ferromagnetic layer 225. Therefore, the first and second ferromagnetic layers 223, 225 are pinned layers. The magnetization vector 228 of the free layer 221 can be changed during a read process and the magnetization vector 229 of the pinned second ferromagnetic layer 225 is fixed during a read process but may be changed during a write process.

Figure 3A:
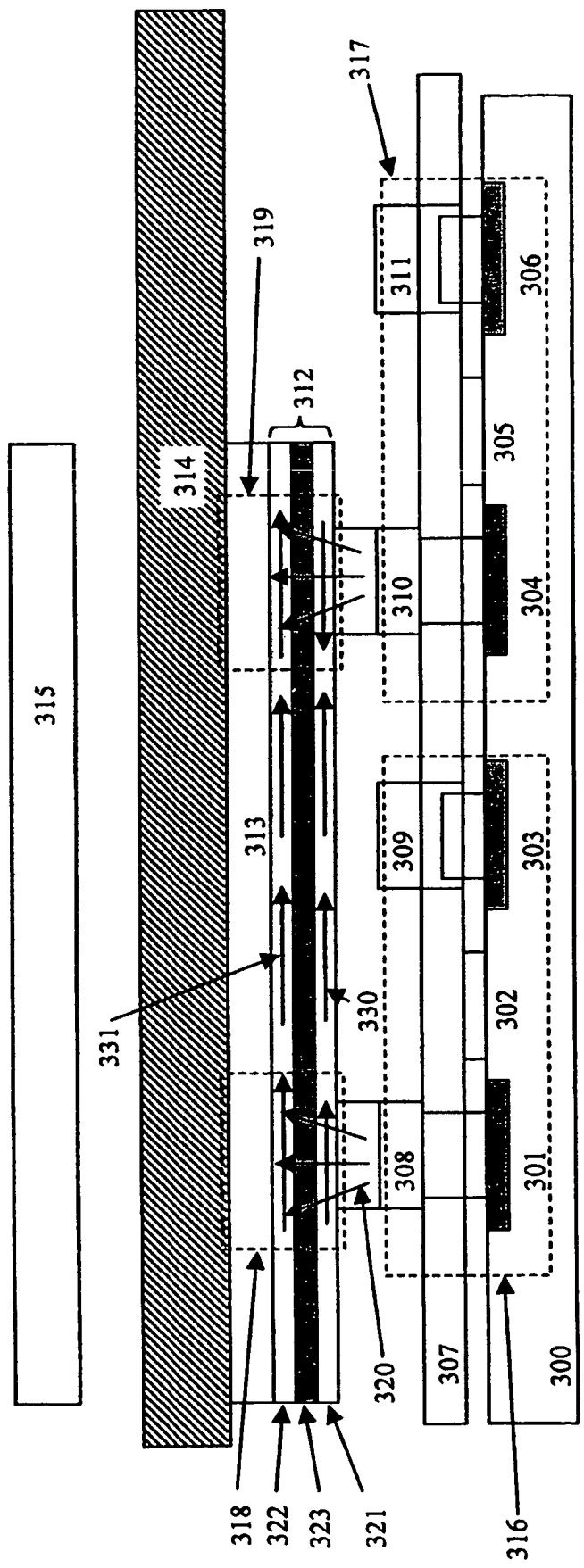
FIG. 3A is a cross section showing a MRAM cell structure having two MRAM cells each with a CPP magnetoresistive element such as a MTJ element or a CPP SV element according to an embodiment of the present invention.

FIG. 3A is a cross section showing a MRAM cell structure according to an embodiment of the present invention, wherein the MRAM cell structure has in this cross section two MRAM cells each realized by an effective magnetoresistive element of current-perpendicular-to-plane (CPP) type such as a magnetic tunnel junction (MTJ) element or a CPP spin-valve (SV) element. A transistor 316 with first source/drain electrode 301, gate electrode 302, and second source/drain electrode 303 is formed on a substrate 300. Another transistor 317 with first source/drain electrode 304, gate electrode 305, and second source/drain electrode 306 is also formed on the substrate 300. More transistors can be formed on the substrate, only two transistors are shown here for simplicity. A word line 307 is electrically connected with the gate electrodes 302 and 305. Bit lines 309 and 311 are electrically connected with the second source/drain electrodes 303 and 306, respectively. A common memory block 312 is formed above the transistors 316 and 317. The common memory block 312 is electrically connected with the first source/drain electrodes 301 and 304 of the transistors 316 and 317 through contacts 308 and 310 at respective active areas of the common memory block 312. Effective magnetoresistive elements 318 and 319 are formed at the respective active areas of the common memory block 312. More than two effective magnetoresistive elements can be formed when considering more than two transistors. In each case, one contact represents one effective magnetoresistive element in the common memory block 312. It has to be noted that in the common memory block 312 the active areas and, therefore, the effective magnetoresistive elements are separated magnetically instead of physically, and that the effective magnetoresistive elements do not interfere magnetically with each other. A common auxiliary electrode 313 is formed above the common memory block 312. The common auxiliary electrode 313 can be a protective layer for the common memory block 312 and patterned simultaneously with the common memory block 312. The size of the common memory block 312 depends on the size and number of contacts 308, 310 and the layer structure of the common memory block 312. A common electrode 314 is electrically connected to the common memory block 312 through the common auxiliary electrode 313. A common digital line 315 is formed electrically insulated above the common electrode 314. As the effective magnetoresistive elements 318 and 319 are not confined by a physical barrier since they are formed in the same common memory block 312, the currents 320 passing through the effective magnetoresistive elements 318, 319 are not completely perpendicular to the plane of the common memory block 312, and a shunting effect should be considered.

The common memory block 312 comprises a ferromagnetic recording layer 321 next to the contacts 308, 310 having magnetization vectors 330, a free magnetic reading layer 322 next to the common auxiliary electrode 313 having magnetization vectors 331, and a non-magnetic space layer 323 between the ferromagnetic recording layer 321 and the free magnetic reading layer 322. The ferromagnetic recording layer 321 is a pinned layer with respect to its magnetization vectors 330. During writing a data bit into, e.g., the effective magnetoresistive element 318, firstly only the effective magnetoresistive element 318 is heated by means of a heating current 320 and than the direction of the respective magnetization vector 330 of the ferromagnetic recording layer 321 in the effective magnetoresistive element 318 is adjusted by means of a current passing through the common digital line 315. After cooling down the effective magnetoresistive element 318, the direction of the respective magnetization vector 330 of the ferromagnetic recording layer 321 at the effective magnetoresistive element 318 is fixed. Please note that a heat element (not shown) may be provided in thermal contact to each effective magnetoresistive element for assisting heating the effective magnetoresistive element by means of the heating current 320 conducted also through the respective heat element. For a detailed description of such a writing process please refer to the description of FIGS. 4A and 4B. During a reading process, the differences between the common orientation of the magnetization vectors 331 in the free magnetic reading layer 322 and the individual orientation of the magnetization vectors 330 in the ferromagnetic recording layer 321 cause a corresponding resistance value across the common memory block 312 at each of the effective magnetoresistive elements 318, 319 representing a respective specific stored data bit.

Figure 3B:
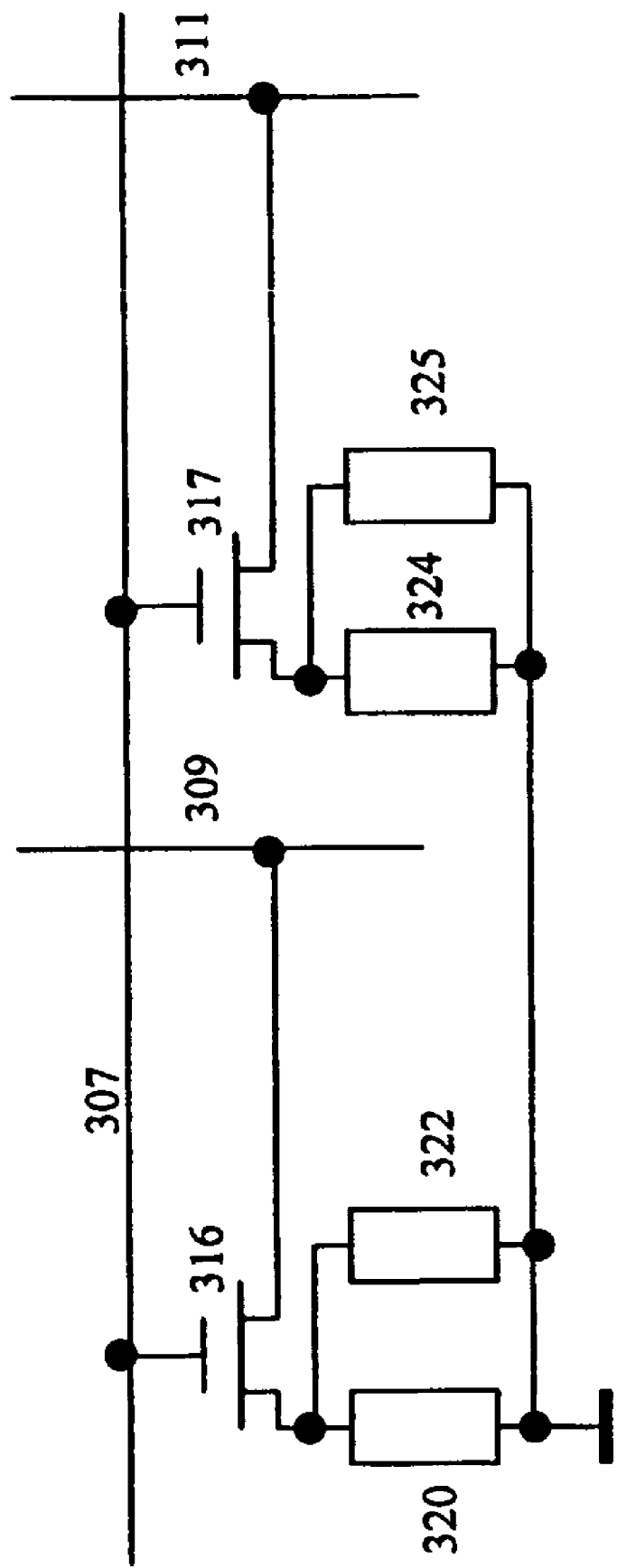
FIG. 3B is an equivalent circuit of the two MRAM cells shown in FIG. 3A.

The equivalent circuit of the MRAM cell structure shown in FIG. 3A is shown in FIG. 3B. Resistors 320 and 324 represent the effective magnetoresistive elements 318, 319, and the resistors 322 and 325 are additional resistors that take into account the shunting effect.

Figure 3C:
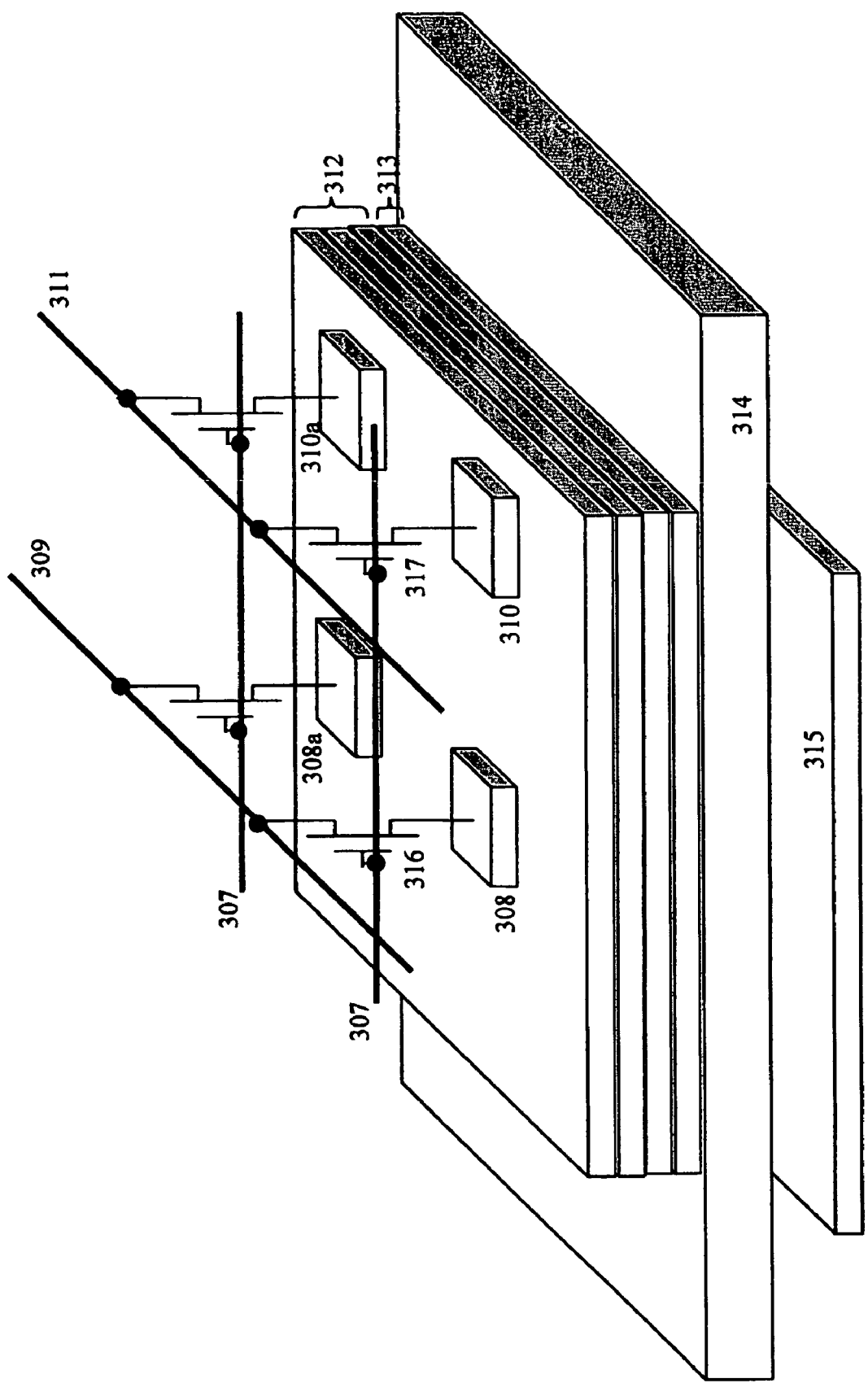
FIG. 3C is a different view of the MRAM cell structure shown in FIG. 3A.

FIG. 3C is a different, three-dimensional view showing the MRAM cell structure shown in FIG. 3A upturned. In this different view, the common digital line 315 is at the bottom of the common electrode 314, and the common memory block 312 and the common auxiliary electrode 313 are on top of the common electrode 314. The common memory block 312 is electrically connected to bit lines 309 and 311 through contacts 308, 310 and transistors 316, 317. The gate electrodes 302, 305 of the transistors 316, 317 are electrically connected to the word lines 307. Four contacts 308, 310, 308a and 310a are shown in FIG. 3C for illustration purposes only, but it should not limit the number of contacts that can be formed on the common-memory block 312. Each of the contacts 308, 310, 308a and 310a serves as a probe, which only detects the resistance of the effective magnetoresistive element next to the respective contact. The current density corresponding to an individual contact is confined in a very small area in the common memory block 312.

Contrary to the provision of individual memory cells located next to each other as common in the prior art, the common memory block of the present invention comprising said plurality of active areas forming effective magnetoresistive elements or memory cells results in a considerably increased memory cell density compared with the prior art. Since the common memory block of the present invention is much larger than one active area, there is no requirement of fine patterning of a magnetoresistive element that is of a size of the active area. The size of the common memory block depends upon many factors such as the heating current, the size of the contacts, the total thickness of the common memory block, the magnetic field generated by the common digital line and the word line or the bit line, etc.

A detailed writing process is shown in FIGS. 4A and 4B. The contact 308 is electrically connected to the common memory block 312 at an active area forming an effective magnetoresistive element 318. The contact 308 serves as a write/read head for the effective magnetoresistive element 318. The separated common digital line 315 serves as write line, which switches the corresponding magnetization vector 330 of the ferromagnetic recording layer 321 at the effective magnetoresistive element 318 during a write process, and as read line, which switches the magnetization vectors 331 of the free magnetic reading layer 322 at the effective magnetoresistive element 318 during a read process. The free magnetic reading layer 322 may be a ferromagnetic layer or multilayer and is made of a ferromagnetic material such as CoFe, NiFe and their alloys. The ferromagnetic recording layer 321 may be either a hard magnetic layer made of ferromagnetic material with large coercitivity such as CrCoPt, DyCo, Tbco, etc., which ferromagnetic materials have a coercitivity of more than 200 Oe, or a pinned ferromagnetic layer made of ferromagnetic material such as CoFe, NiFe and their alloys, which is pinned by a pinning layer made of an AFM material such as IrMn, PtMn, FeMn and their alloys. The non-magnetic space layer 323 is made of non-magnetic material such as either Cu, Au, etc. for spin-valve CPP or AlO, TaO for MTJ where the non-magnetic space layer 323 functions as tunneling barrier layer. The ferromagnetic recording layer 321 has a critical temperature which is the blocking temperature of the AFM material of the pinning AFM layer. For an AFM layer, when the temperature approaches or exceeds the critical temperature, an external field can easily change the pinning direction of the adjacent, pinned ferromagnetic layer. The critical temperature is in the range of 100° C. and 400° C. for common AFM layers. For a hard magnetic layer, when the temperature approaches or exceeds the critical temperature, the coercitivity is reduced to near zero and, thus, a small external field can switch the hard magnetic layer's magnetization state. The critical temperature for a hard magnetic layer is the Curie temperature being in the range of 100° C. and 600° C. for common hard magnetic layers.

For instance, when a current pulse 320 is applied through the contact 308, the current pulse 320 heats the effective magnetoresistive element 318. When the temperature of the ferromagnetic recording layer 321 at the effective magnetoresistive element 318 approaches or exceeds the critical temperature of the ferromagnetic recording layer 321 due to heating, a current 401A passing through the separated common digital line 315, which has a direction toward inside the drawing plane of FIG. 4A, introduces a magnetic field with positive direction to align the corresponding magnetization vector 330 of the ferromagnetic recording layer 321 at the effective magnetoresistive element 318 to a first direction 402A as shown in FIG. 4A. Then, the current pulse 320 is removed, the effective magnetoresistive element 318 cools down to ambient temperature, and the first direction 402A of the corresponding magnetization vector 330 remains is fixed as shown in FIG. 4A. On the other hand, when the effective magnetoresistive element 318 approaches or exceeds the critical temperature of the ferromagnetic recording layer 321 due to heating by means of current pulse 320, a current 401B passing through the separated common digital line 315, which has a direction toward outside the drawing plane of FIG. 4B, introduces a magnetic field with negative direction to switch the corresponding magnetization vector 330 at the effective magnetoresistive element 318 to a second direction 402B opposite the first direction 402A as shown in FIG. 4B. After cooling down, the second direction 402B of the magnetization vector 330 of the corresponding effective magnetoresistive element 318 remains fixed as shown in FIG. 4B. In order to obtain recording areas or effective magnetoresistive elements as small as possible, the current pulses 320 applied through the common memory block 312 should be well confined to minimize shunting effects, and a material with a large anisotropy energy is required for the ferromagnetic recording layer 321 in order to reduce the transient parameter. A soft ferromagnetic layer is not suitable to serve as the ferromagnetic recording layer 321 due to the large transient parameter. Both hard ferromagnetic material with high coercitivity and ferromagnetic material pinned by an antiferromagnetic material is suitable for the ferromagnetic recording layer 321. When the temperature of the ferromagnetic recording layer 321 rises to approach or exceed its critical temperature, the magnetization vectors 330 of the ferromagnetic recording layer 321 can be easily switched, and the magnetization state can be maintained once the ferromagnetic recording layer 321 is cooled down to ambient temperature. A synthetic-antiferromagnetic-pinned (SAFP) multi-layer used as ferromagnetic recording layer 321 causes a higher thermal stability and a higher heating tolerance for the common memory block 312 compared with the above described stack of three layers. In such a SAFP multilayer, at least two ferromagnetic layers are antiferromagnetically coupled, and they are pinned by an antiferromagnetic layer. In order to improve the thermal stability, more than two antiferromagnetically coupled ferromagnetic layers can be used in such a SAFP multi-layer. Further details on improving the thermal stability and heating tolerance can be found in Y. K. Zheng et al.: "High thermal stability MRAM with SAF layer" in IEEE Trans. MAG. 40, No. 4, pp. 2248-2250, 2004. As the coercivity of a ferromagnetic material reduces rapidly when the temperature rises to the Curie temperature, ferromagnetic materials such as TbFeCo, DyFeCo and their alloys are also good candidates for the ferromagnetic recoding layer 321. Generally, any ferromagnetic material can be used for the ferromagnetic recording layer 321.

Figure 5B:
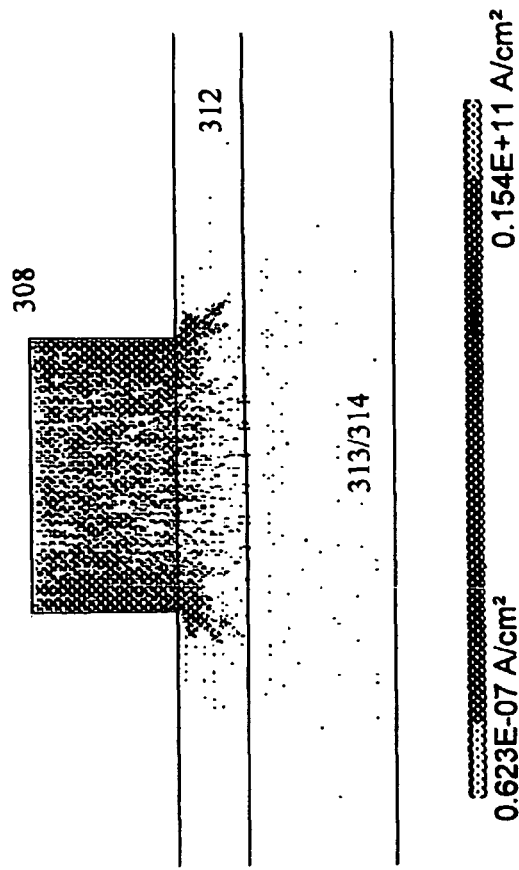
FIGS. 5A and 5B show the voltage potential and current density distributions for a CPP type MRAM cell after applying a voltage on the contact according to the embodiment of the present invention.
Figure 5A:
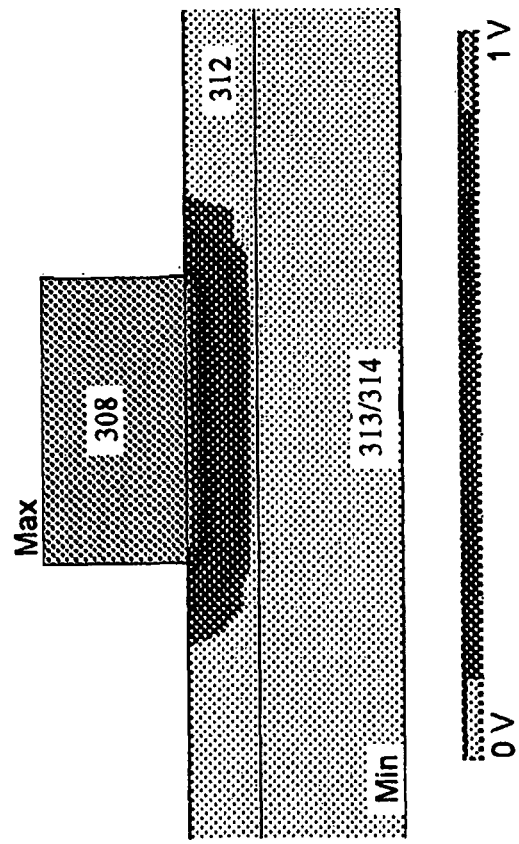

One issue in the proposed MRAM cell structure is how to confine the current of the current pulses 320 in the effective magnetoresistive elements 318, 319. FIGS. 5A and 5B show the voltage potential distribution and the current density distribution, respectively, for a CPP type MRAM cell (only one effective magnetoresistive element) after applying a voltage on the contact 308. Here, the dimension of the contact 308 is 100 nm×100 nm, the space between the contact 308 and the common auxiliary electrode 313/common electrode 314 representing the thickness of the common memory block 312 is 25 nm, and the effective resistivity is 200 $\mu\Omega \cdot cm$. From FIGS. 5A and 5B it can be seen that the horizontal size of the effective magnetoresistive element 318, i.e. the size of the effective magnetoresistive element 318 in direction parallel to the main extension of the common memory block 312, is around 1.2 times of the size of the contact 308. FIGS. 6A and 6B show the voltage potential distribution and the current density distribution, respectively, for one CPP MRAM cell (i.e. one effective magnetoresistive element) after considering the effect of a neighboring contact 310. Here, the space between the contacts 308, 310 and the common auxiliary electrode 313/common electrode 314 representing the thickness of the common memory block 312 is 50 nm. The neighboring contact 310 has very limited effect on the size of the effective magnetoresistive element 318 and the shunting effect. Generally, the size of the effective magnetoresistive elements 318, 319 reduces as the space between the contacts 308, 310 and the common auxiliary electrode 313/common electrode 314 representing the thickness of the common memory block 312 reduces. Further details on reducing the shunting effect can be found in Y. K. Zheng et al.: "Sub-100 nm current-perpendicular-to-plane sensor fabrication" in IEEE Trans. MAG. 40, No. 4, pp. 2634-2636, 2004.

Figure 7:
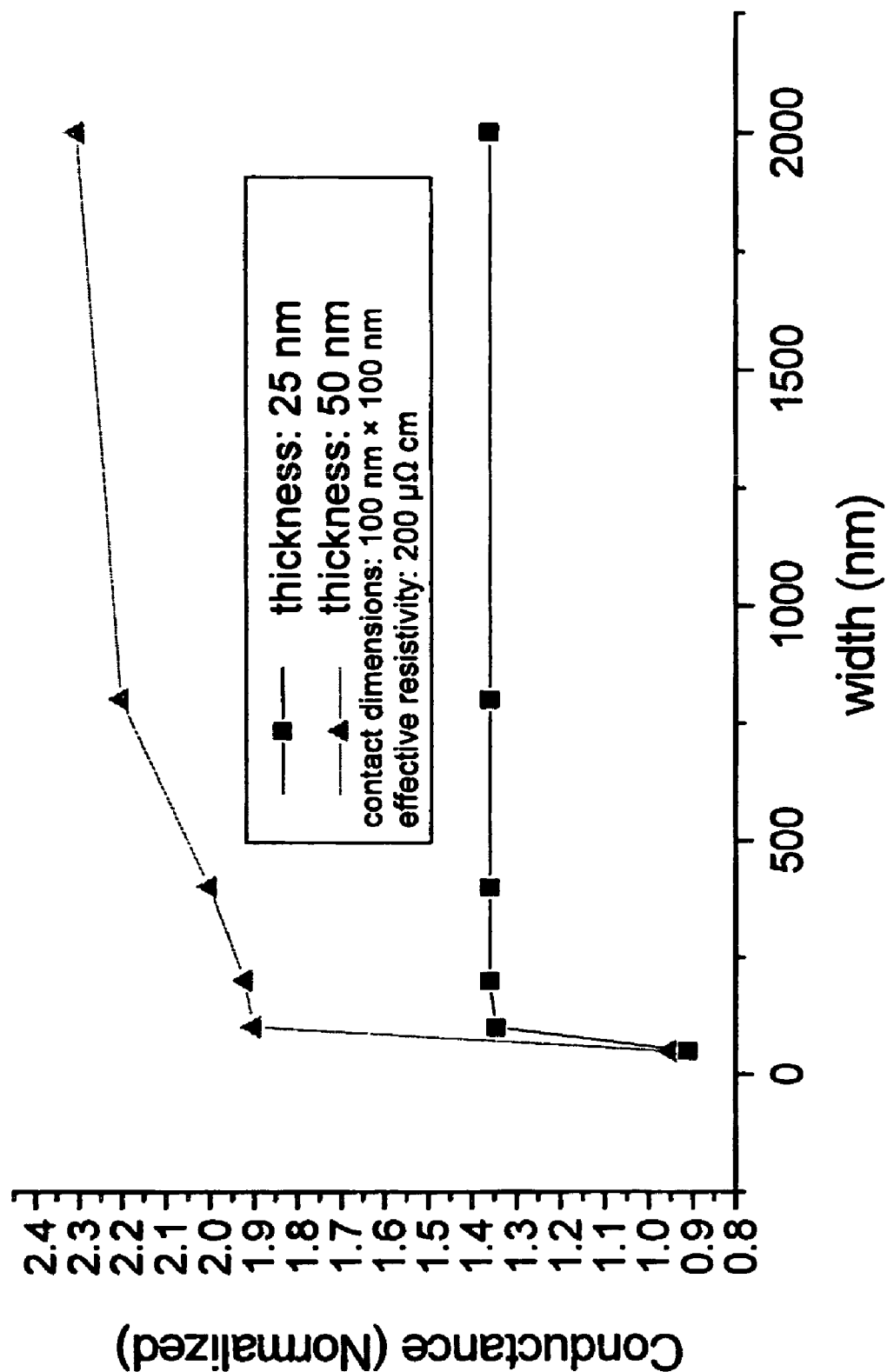
FIG. 7 shows the conductance dependence on the width of the common memory block with different thicknesses or space between the contact and the electrode according to the embodiment of the present invention.

FIG. 7 shows the conductance dependence on the width of the common memory block 312 with different thicknesses. The conductance of an effective magnetoresistive element having a width of 2 micron is about 1.4 times of a patterned magnetoresistive element of the same size. The extra conductance results from the shunting effect of the effective magnetoresistive element 318, 319 in the common memory block 312. In order to read the recorded signal, a reading current 401A, 401B can be applied to the common digital line 315 to switch the magnetization vectors 331 of the free magnetic reading layer 322 of the non-heated common memory block 312. As the coercivity of the common memory block 312 is much smaller than that of a patterned magnetoresistive element, the read power decreases.

Figure 8A:
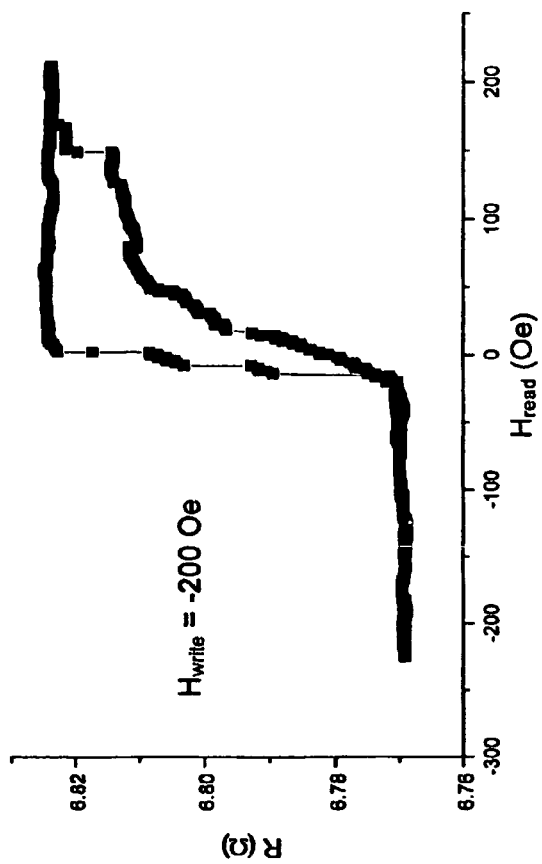
FIGS. 8A and 8B show typical MR-H curves after thermal assistant writing according to the embodiment of the present invention.
Figure 8B:
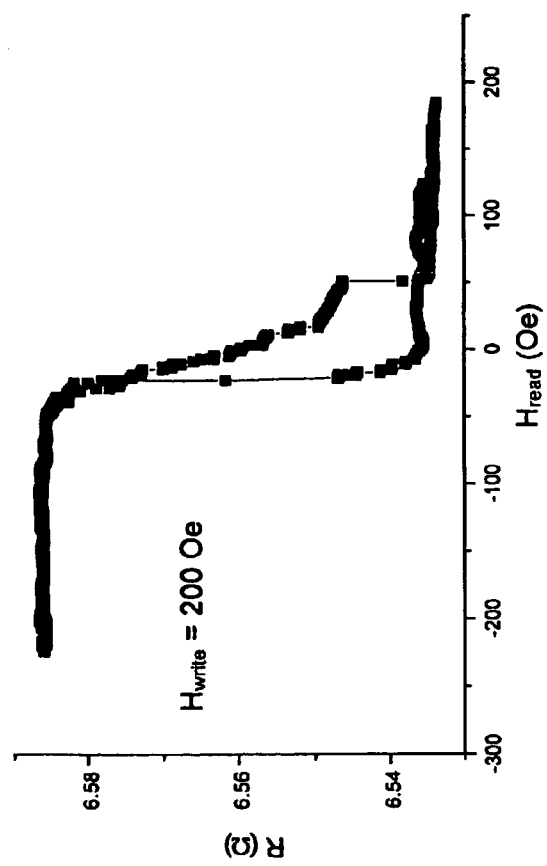

FIGS. 8A and 8B show the experimental magnetoresistance curves of a effective magnetoresistive element 318 according to the embodiment of the present invention. The X-axes represent the external reading magnetic field $H_{read}$ in Oersted (Oe) and the Y-axes represent the magnetic resistance R in Ohm ($\Omega$). In particular, the hysteresis loops of the curves shown in FIGS. 8A and 8B are due to raising the reading current from minus maximum (current 401B passing through the separated common digital line 315, which has a direction toward outside the drawing plane of FIG. 4B) to its positive maximum value (current 401A passing through the separated common digital line 315, which has a direction toward inside the drawing plane of FIG. 4A) and than back from its positive maximum value (current 401A) to minus maximum (current 401B). FIG. 8A represents the hysteresis curve of the experimental magnetoresistance of the effective magnetoresistive element 318 which was written with a positive external writing magnetic field $H_{write}$=200 Oe and a heating current of 30 mA. Since at the left end of the hysteresis curve shown in FIG. 8A the external reading magnetic field $H_{read}$ causes a magnetization direction in the free magnetic reading layer 322 which is antiparallel to the magnetization direction stored in the ferromagnetic recording layer 321 at the effective magnetoresistive element 318 upon the external writing magnetic field $H_{write}$, the experimental magnetoresistance of the effective magnetoresistive element 318 is high. At the right end of the hysteresis curve shown in FIG. 8A the external reading magnetic field $H_{read}$ causes a magnetization direction in the free magnetic reading layer 322 which is parallel to the magnetization direction stored in the ferromagnetic recording layer 321 at the effective magnetoresistive element 318 upon the external writing magnetic field $H_{write}$, the experimental magnetoresistance of the effective magnetoresistive element 318 is low. FIG. 8B represents the hysteresis curve of the experimental magnetoresistance of the effective magnetoresistive element 318 which was written with a negative external writing magnetic field $H_{write}$=-200 Oe and a heating current of 30 mA. Since at the left end of the hysteresis curve shown in FIG. 8B the external reading magnetic field $H_{read}$ causes a magnetization direction in the free magnetic reading layer 322 which is parallel to the magnetization direction stored in the ferromagnetic recording layer 321 at the effective magnetoresistive element 318 upon the external writing magnetic field $H_{write}$, the experimental magnetoresistance of the effective magnetoresistive element 318 is low. At the right end of the hysteresis curve shown in FIG. 8B the external reading magnetic field $H_{read}$ causes a magnetization direction in the free magnetic reading layer 322 which is antiparallel to the magnetization direction stored in the ferromagnetic recording layer 321 at the effective magnetoresistive element 318 upon the external writing magnetic field $H_{write}$, the experimental magnetoresistance of the effective magnetoresistive element 318 is high.

Figure 8D:
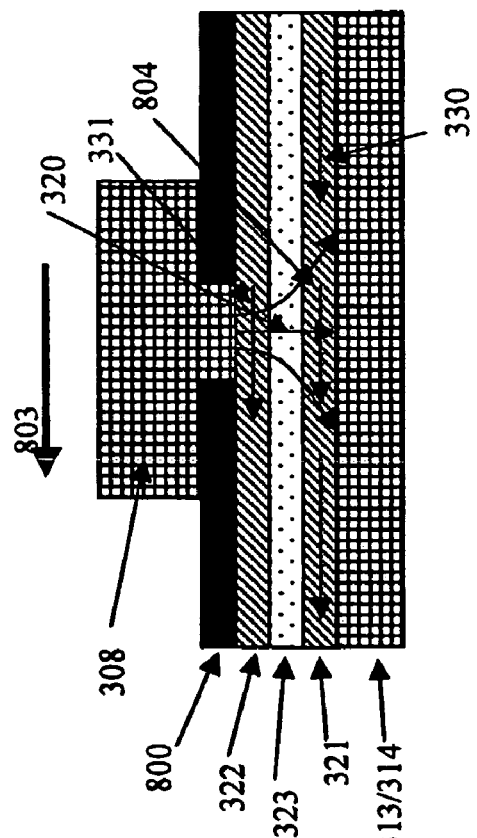
FIGS. 8C and 8D show the magnetization states for the MRAM cell after thermal assistant writing according to the embodiment of the present invention.
Figure 8C:
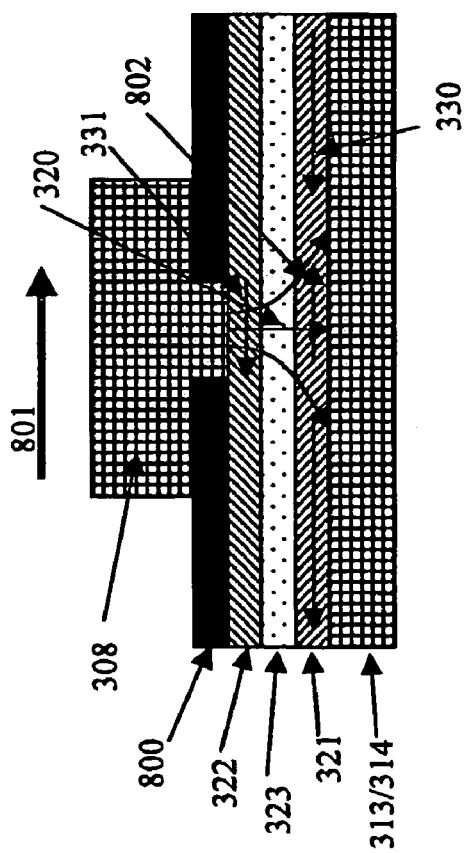

FIGS. 8C and 8D show the magnetization states for an effective magnetoresistive element 318 after thermal assistant writing. When a current pulse 320 is applied through the contact 308 to the common auxiliary electrode 313/common electrode 314, thereby passing through the ferromagnetic recording layer 321, the non-magnetic space layer 323, and the free magnetic reading layer 322, the temperature in the active area increases to above the critical temperature of the effective magnetoresistive element 318. The active area defined by the current pulse 320 passing through the ferromagnetic recording layer 321 can be further confined by a suitably placed electrically insulating confinement layer 800 comprising an opening of defined form and dimensions between the contact 308 and the ferromagnetic recording layer 321. A coincident positive magnetic field 801 generated from the digital current 406A passing along the common digital line 315 as shown in FIG. 4A can easily adjust the magnetization state 802, i.e. the direction of the local magnetization vector 330, of the ferromagnetic recording layer 321 at the effective magnetoresistive element 318. After that, the current pulse 320 is switched off, and the active area of the effective magnetoresistive element 318 cools down to ambient temperature. Even if there is no external magnetic field, the magnetization state 802 can be maintained as shown in FIG. 8C. Similarly, the magnetization state 804, i.e. the direction of the local magnetization vector 330, of the ferromagnetic recording layer 321 at the effective magnetoresistive element 318 can be maintained after applying the current pulse 320 and a negative external magnetic field 803 as shown in FIG. 8D, and after cooling down the active area of the effective magnetoresistive element 318 to ambient temperature. The recording and reading technique described in the present invention can also be used to record and read a spin-inject switching CPP MRAM cell memory, CRAM and a programmable metallization cell (PMC) memory. The thermal assistant writing is not required in the spin-inject MRAM cell memory and the PMC memory.

Whilst the present invention has been described with reference to a specific embodiment it should be appreciated that modifications and improvements may be made to the invention without departing from the scope of the invention as defined in the following claims.

What is claimed is:

1. A magnetoresistive random access memory (MRAM) unit comprising:
   a substrate;
   a plurality of transistors formed on said substrate, each of said plurality of transistors being a field-effect transistor comprising a first source/drain electrode, a second source/drain electrode and a gate electrode;
   a plurality of active areas defined in a common memory block comprising a ferromagnetic recording layer, a free magnetic reading layer, a non-magnetic space layer between said ferromagnetic recording layer and said free magnetic reading layer;
   a plurality of contacts, each of said plurality of contacts electrically connecting a respective one of said first source/drain electrodes with a corresponding one of said plurality of active areas; and
   a common electrode in electrical contact with said plurality of contacts through said common memory block, said common electrode serving as bit line for said first source/drain electrodes;
   wherein each of said plurality of active areas forms an effective magnetoresistive element; and
   wherein each of said plurality of transistors is controllable to electrically activate a corresponding one of said plurality of contacts and thereby to write/read a data bit into/from said ferromagnetic recording layer at a respective one of said effective magnetoresistive elements.

2. The MRAM unit as claimed in claim 1, wherein said corresponding one of said plurality of contacts is electrically activatable by means of electrically connecting said respective one of said first source/drain electrodes with said corresponding second source/drain electrode.

3. The MRAM unit as claimed in claim 1, wherein a plurality of bit lines is in electrical contact with said second source/drain electrodes.

4. The MRAM unit as claimed in claim 1, wherein a plurality of word lines is in electrical contact with said gate electrodes.

5. The MRAM unit as claimed in claim 1, wherein a common auxiliary electrode is provided in electrical contact between said common electrode and said common memory block.

6. The MRAM unit as claimed in claim 1, wherein a common digital line is provided next to said common electrode on an opposite side of said common electrode with respect to said common memory block.

7. The MRAM unit as claimed in claim 6, wherein said common digital line is electrically insulated from said common electrode.

8. The MRAM unit as claimed in claim 1, wherein said ferromagnetic recording layer is provided between said common electrode and said non-magnetic space layer.

9. The MRAM unit as claimed in claim 1 wherein an electrically insulating confinement layer comprising a plurality of openings corresponding to said plurality of contacts is provided between said common memory block and said plurality of contacts.

10. The MRAM unit as claimed in claim 1, wherein said ferromagnetic recording layer is a synthetic antiferromagnetic pinned multi-layer comprising at least two antiferromagnetically coupled ferromagnetic layers pinned by an antiferromagnetic (AFM) layer.

11. The MRAM unit as claimed in claim 1, wherein said ferromagnetic recording layer is a hard magnetic layer.

12. The MRAM unit as claimed in claim 1, wherein said ferromagnetic recording layer is a ferromagnetic layer coupled with a hard magnetic layer.

13. The MRAM unit as claimed in claim 1, wherein said common memory block further comprises a template layer next to said plurality of contacts and a cap layer next to said common electrode.

14. The MRAM unit as claimed in claim 13, wherein at least one of said template layer, said cap layer and said free magnetic layer is a multi-synthetic ferrimagnetic layer.

15. The MRAM unit as claimed in claim 1, wherein said plurality of contacts is arranged in form of an array.

16. The MRAM unit as claimed in claim 6, wherein said common digital line is adapted to cause a magnetic field in said ferromagnetic recording layer at an activated one of said effective magnetoresistive elements upon a current passing through said common digital line.

17. The MRAM unit as claimed in claim 1, further comprising in each case a heat element adjacent to each effective magnetoresistive element.

18. The MRAM unit as claimed in claim 1, wherein said common memory block is a stacked current-perpendicular-to-plane (CPP) structure such as a magnetic tunnel junction (MTJ) or a CPP spin-valve (SV).

19. A method of writing data in a MRAM unit which comprises a plurality of transistors on a substrate, each of said plurality of transistors being a field-effect transistor and comprising first and second source/drain electrodes and a gate electrode, a plurality of active areas defined in a common memory block which is electrically connected to each of said first source/drain electrodes through in each case one of a plurality of contacts, a common electrode electrically contacting said plurality of contacts through said common memory block, and a common digital line provided electrically isolated next to said common electrode on an opposite side of said common electrode with respect to said common memory block, said common memory block comprising a ferromagnetic recording layer, a free magnetic reading layer, a non-magnetic space layer between said ferromagnetic recording layer and said free magnetic reading layer, said method comprising:

controlling said plurality of transistors for electrically activating a corresponding one of said plurality of contacts, thereby electrically activating a respective active area of said plurality of active areas, said activated respective active area serving as effective magnetoresistive element;

raising the temperature of said ferromagnetic recording layer at said effective magnetoresistive element to approach or exceed its critical temperature independently of other active areas, thereby reducing the coercitivity of said ferromagnetic recording layer at said effective magnetoresistive element; and writing a magnetization state representing a bit of said data in said ferromagnetic recording layer at said effective magnetoresistive element by passing a current through said common digital line.

20. The method according to claim 19, further comprising cooling down said ferromagnetic recording layer at said effective magnetoresistive element to nearly ambient temperature after writing said magnetization state in said ferromagnetic recording layer at said effective magnetoresistive element.

21. The method according to claim 19, wherein raising the temperature of said ferromagnetic recording layer at said effective magnetoresistive element to above its critical temperature independently of other active areas further comprises passing a heating current partly through said common electrode, completely through said effective magnetoresistive element, completely through said activated corresponding one of said plurality of contacts and completely through said controlled one of said plurality of transistors via said corresponding first and second source/drain electrodes.

22. The method according to claim 21, further comprising passing said heating current through a heat element being thermally coupled to said effective magnetoresistive element.

23. The method according to claim 21, further comprising electrically confining said heating current by means of providing an electrically insulating confinement layer comprising a plurality of openings corresponding to said plurality of contacts between said common memory block and said plurality of contacts.

24. The method according to claim 19, wherein controlling said plurality of transistors comprises applying a control voltage to said gate electrode of a respective one of said plurality of transistors and applying a voltage difference to said first and second source/drain electrodes of said respective one of said plurality of transistors.

25. A method of performing a read operation in a MRAM unit which comprises a plurality of transistors on a substrate, each of said plurality of transistors being a field-effect transistor and comprising first and second source/drain electrodes and a gate electrode, a plurality of active areas defined in a common memory block which is electrically connected to each of said first source/drain electrodes through in each case one of a plurality of contacts, a common electrode electrically contacting said plurality of contacts through said common memory block, and a common digital line provided electrically isolated next to said common electrode on an opposite side of said common electrode with respect to said common memory block, said common memory block comprising a ferromagnetic recording layer, a free magnetic reading layer, a non-magnetic space layer between said ferromagnetic recording layer and said free magnetic reading layer, said method comprising:

controlling said plurality of transistors for electrically activating a corresponding one of said plurality of contacts, thereby electrically activating a respective active area of said plurality of active areas, said activated respective active area serving as effective magnetoresistive element;

applying a current through said common digital line, thereby adjusting all magnetization states in said free magnetic reading layer; and determining the magnetization state of said ferromagnetic recording layer at said effective magnetoresistive element, wherein the resistance states of said ferromagnetic recording layer at said effective magnetoresistive element are dependent on the relative angles between the magnetization vectors of said ferromagnetic recording layer at said effective magnetoresistive element and of said free magnetic reading layer.

26. The method according to claim 25, wherein controlling said plurality of transistors comprises applying a control voltage to said gate electrode of a respective one of said plurality of transistors and applying a voltage difference to said first and second source/drain electrodes of said respective one of said plurality of transistors.

* * * * *